United States Patent [19]

Hirabayashi

[11] 4,085,459
[45] Apr. 18, 1978

[54] MULTIVALUED DATA MEMORY SYSTEM USING A CHARGE COUPLED ELEMENT

[75] Inventor: Kanji Hirabayashi, Sagamihara, Japan

[73] Assignee: Tokyo Shibaura Electric Co., Ltd., Tokyo, Japan

[21] Appl. No.: 722,100

[22] Filed: Sep. 10, 1976

[30] Foreign Application Priority Data

Sep. 13, 1975 Japan .................................. 50-111213

[51] Int. Cl.$^2$ ........................ G11C 7/00; G11C 11/56
[52] U.S. Cl. .................................... 365/222; 365/75; 365/184
[58] Field of Search ..... 340/173 R, 173 RC, 173 DR; 307/221 D

[56] References Cited

U.S. PATENT DOCUMENTS

| | | | |
|---|---|---|---|
| 3,891,977 | 6/1975 | Amelio et al. | 340/173 R |
| 3,909,806 | 9/1975 | Uchida | 340/173 R |
| 3,956,624 | 5/1976 | Audaire et al. | 235/194 |
| 3,958,210 | 5/1976 | Levine | 340/173 R |

Primary Examiner—Stuart N. Hecker
Assistant Examiner—Donald McElheny
Attorney, Agent, or Firm—Finnegan, Henderson, Farabow & Garrett

[57] ABSTRACT

A memory system includes means for injecting a multivalued signal with at least three information carrying voltage levels, in the form of electric charge, to a charge coupled device (CCD); and a detection means for detecting a multivalued signal level read out from the output terminal of CCD and feeding the voltage of the level back to the injecting means. The detection means comprises a level detection section for generating a combination of outputs predetermined correspondingly to the multivalued signal level and an output section for generating upon receipt of the combination of outputs an output having a voltage level corresponding to the combination of outputs.

4 Claims, 6 Drawing Figures

MULTIVALUED DATA MEMORY SYSTEM USING A CHARGE COUPLED ELEMENT

BACKGROUND OF THE INVENTION

This invention relates to a memory system using a charge coupled device, and in particular a memory system having a means for increasing a memory capacity.

A charge-coupled device (hereinafter referred to as "CCD") is adapted in a digital memory system. The reason is that CCD permits high density storage and it also allows a low cost memory system. An increased storage density of CCD will result in a memory system with increased capacity. One method for attaining increased capacity is to make the geometrical dimension of the memory cell or potential well of CCD small. However, reduction of the geometrical dimension of the memory cell provides a limitation from the standpoint of the manufacturing accuracy of CCD per se. Another method is to inject a multivalued signal with at least three information carrying voltage levels, in the form of electric charge, into CCD. A currently available CCD uses a binary (two-valued) signal having two voltage levels, i.e., "0" and "1". That is, only two information "0" and "1" are available in this case. However, difficulty arises as to how, for example, a three-valued signal with voltage levels "0", "1" and "2" is injected into CCD and each of the three voltage levels of the three-valued signal is correctly detected from the output of CCD. For this reason, a means for detecting such a multivalued signal from the output of CCD has not been realized to date. This provides a bar to marked increase of the storage capacity of a CCD built in memory system. It is accordingly the object of this invention to provide a memory system using CCD having a means for injecting a multivalued signal with at least three voltage levels, in the form of electric charge into CCD and detecting it from the output of CCD.

SUMMARY OF THE INVENTION

According to this invention there is provided a memory system comprising a charge coupled device (CCD) for storing a multivalued signal with at least three information carrying voltage levels, injection means for injecting the multivalued signal in the form of electric charge into CCD; and detection means connected to the output terminal of the charge coupled device and adapted to detect the level of the multivalued signal and feed the voltage of the level back to the injection means. The detection means includes a level detection section connected to the output terminal of CCD to generate a combination of outputs predetermined correspondingly to the level of the multivalued signal read out from the output terminal of CCD, and an output section for generating upon receipt of the combination of outputs from the level detection section an output having a voltage level corresponding to the combination of outputs. Thus, each voltage of the multivalued signal is detected in the form of a combination of outputs predetermined accordingly to the detected voltage level in the level detection section and an output having the detected voltage level is produced in the output section. The outputs of the output section in the detection means are time-sequencially fed back to the injection means. That is, the multivalued signal is circulated through the CCD via a feedback circuit.

DETAILED DESCRIPTION OF THE PREFERRED EMBODIMENT

Figure 1:
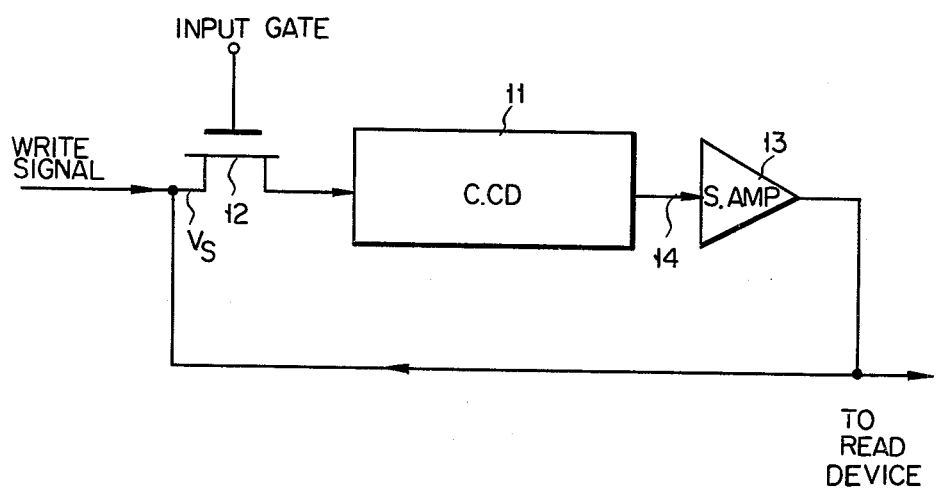
FIG. 1 is a block diagram showing one embodiment of this invention.
Figure 2:
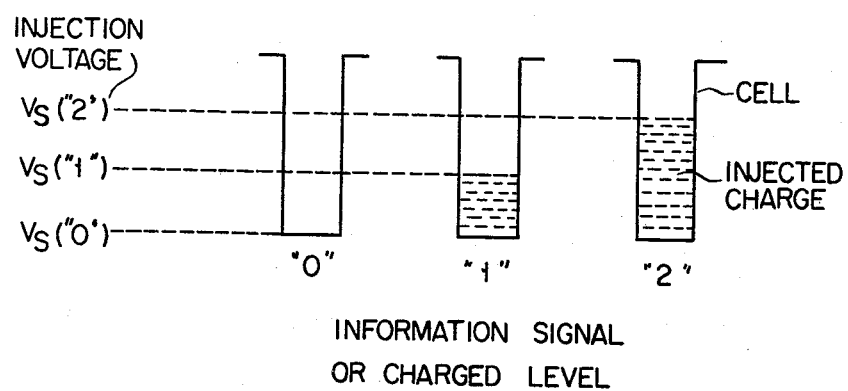
FIG. 2 shows the relationship of the source voltage levels (injection voltage levels) of an injection field effect transistor (FIG. 1) as a multivalued signal injecting means, to the injected charge levels of potential wells or cells in a charge coupled device.

In FIG. 1 the drain of an injection field effect transistor (FET) 12 (for example, a p-channel enhancement mode) for use as a multivalued signal input means is connected to the input terminal of CCD 11. A write signal having a plurality of voltage levels (or a multivalued signal) is supplied to the source of FET 12. A sense amplifier 13 (also referred to herein as a detecting means) is connected to the output terminal of CCD 11 and the output of the sense amplifier 13 is fed to a readout device not shown and back to the source input of injection FET 12. When the multivalued signal is injected in the form of a charge into the CCD 11, after the feedback loop is cut off by a means not shown, the source potential $V_S$ of the input FET 12 is controlled by the multivalued write signal. When a multivalued signal is read out from CCD 11, the output of the sense amplifier 13 is supplied to the readout device, not shown, with the feedback loop closed. FIG. 2 shows the case where the multivalued signal has three voltage levels, i.e., "0", "1" and "2", that is, it shows a relation of the injection levels $V_S("0")$, $V_S("1")$ and $V_S("2")$ applied to the source of the input FET 12, to the surface levels of charges injected by these injection levels into the potential wells or cells of CCD. In other words, the injected charge surface level is set to be increased with an increasing source voltage level.

Figure 3:
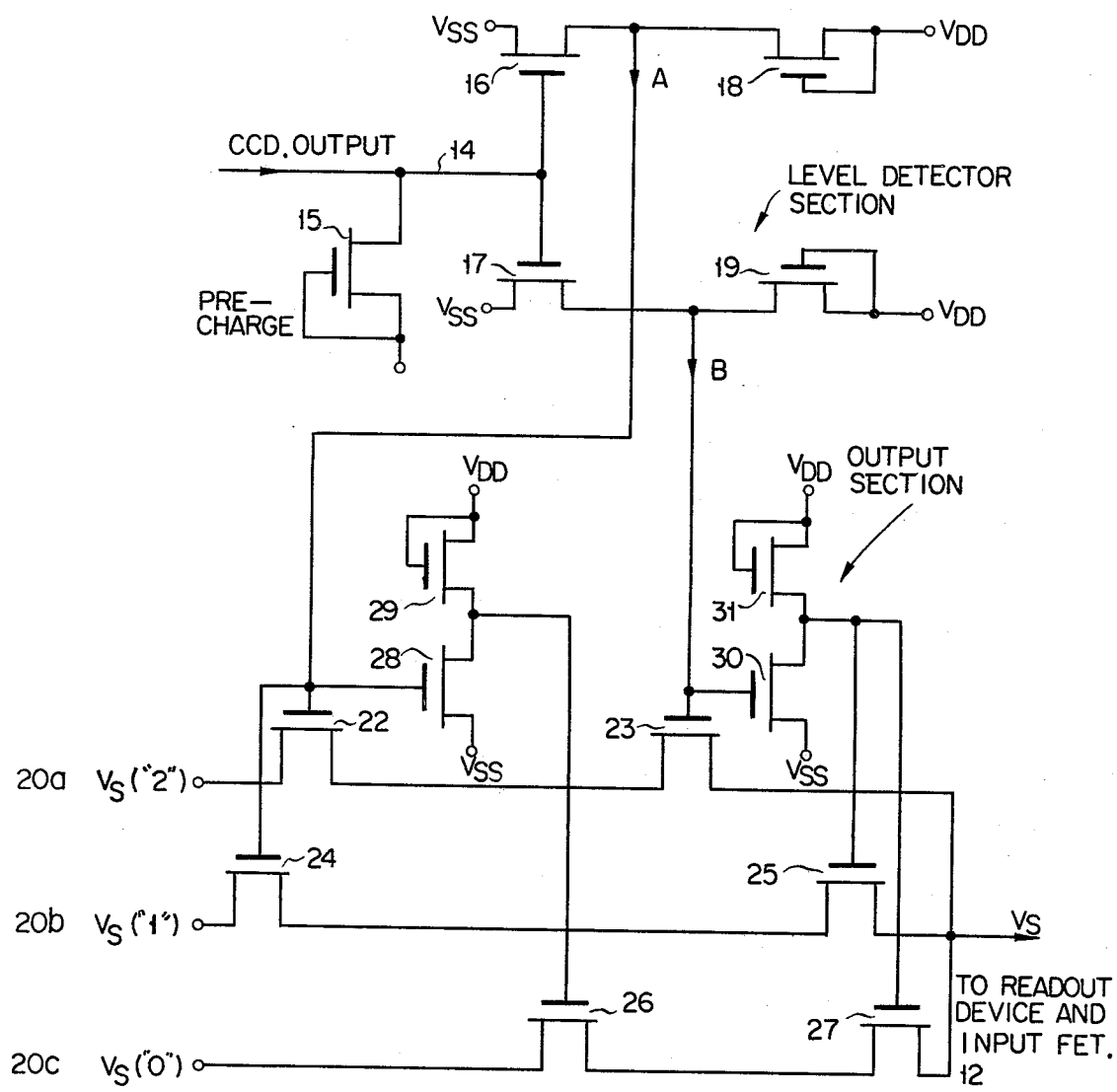
FIG. 3 is a schematic circuit diagram showing one specific arrangement of a sense amplifier which may be used in the system of FIG. 1 in the case of a three-valued signal.

FIG. 3 shows one form of arrangement of the sense amplifier 13 when a three-valued signal is involved. In FIG. 3 each FET is shown as being of a p-channel emhancement mode. $V_{SS}$ represents a source voltage applied to the source of the FET and $V_{DD}$, a drain voltage applied to the drain of the FET. The source of FET 15 as a precharge means is connected to an output line 14 of CCD 11 and FET 15 is short-circuited between the drain and the gate thereof. The gates of FET's 16 and 17 are connected to the output line 14. FFET 18 is short-circuited between the drain and the gate thereof and FET's 16 and 18 are connected in series with each other to provide an inverter. The inverter generates an output A. FET 19 is short-circuited between the drain and the gate thereof and FET's 17 and 19 are connected in series with each other to provide an inverter. This inverter generates an output B.

The threshold voltage value Vth16 of FET 16 is set to be greater than the threshold voltage value Vth17 of FET 17. FET's 16 to 19 constitute a level detector section for a three-valued signal. The level detector section is adapted to detect each level in three-valued signal which is supplied from the output line 14.

A three-level signal generator section is also provided. The signal generator includes three circuits 20a, 20b, and 20c corresponding in number to the voltage levels of the multivalued signal. The circuit 20a includes FET 22 to the source of which the injection level voltage $V_S$("2") is applied and FET 23 connected in series to FET 22. The circuit 20b includes FET 24, to the source of which an injection voltage $V_S$("1") is applied, and FET 25 connected in series to FET 24. The circuit 20c includes FET 26, to the source of which an injection voltage $V_S$("0") is applied, and FET 27 connected in series to FET 26. The sources of FET's 23, 25 and 27 are connected in common with each other and a three-valued signal $V_S$ on the common junction of FET's 23, 25 and 27 is fed back to the source of the input FET 12 (FIG. 1).

Output A from the level detector section is coupled to the gates of FET's 22, 24 and 28. FET 29 is short-circuited between the drain and the source thereof and FET's 28 and 29 are connected in series with each other to provide an inverter. The output of this inverter is supplied to the gate of FET 26. Output B from the level detector section is supplied to the gates of FET's 23 and 30. FET's 30 and 31 are connected in series with each other to provide an inverter. The output of this inverter is coupled to the gates of FET's 25 and 27.

Before a multivalued signal is read out from CCD 11, the gates of FET's 16 and 17 are negatively precharged through precharge FET 15. With the gates of the FET's 16 and 17 negatively charged, FET's 16 and 17 are rendered conductive. Such negative charge is wholly or partly cancelled by a positive charge read out from CCD. When a charge of "0" level is read out from CCD 11, FET's 16 and 17 are both rendered conductive since the negative precharge is not cancelled. As a result, the outputs A and B of the level detector section both become "OFF" signals. When a positive charge of "1" level is next read out, FET 16 is in the "OFF" state and FET 17 remains "ON". This is because the threshold voltage Vth16 of FET 16 is higher than the threshold voltage Vth17 of FET 17. In consequence, the output A of the level detector section becomes an "ON" signal and the output B of the level detector section becomes an "OFF" signal. Upon reading out a "2" level charge from CCD 11, FET's 16 and 17 are both in the "OFF" state and in consequence the outputs A and B of the level detector section become an "ON" signal.

It is to be noted here that the "ON" signal is a signal for causing the FET directly supplied with the outputs A or B to be rendered conductive and the "OFF" signal is a signal for causing the FET directly supplied with the outputs A or B to be rendered nonconductive. The "ON" and "OFF" states of each FET in each of the output circuits 20a to 20c in the output section are shown below in conjunction with a combination of "ON" and "OFF" of FET's 16 and 17.

Table 1

|        | Charged level "0" FET 16: ON FET 17: ON | Charged level "1" FET 16: OFF FET 17: ON | Charged level "2" FET 16: OFF FET 17: OFF |
|--------|---|---|---|
| FET 22 | OFF | ON | ON |
| FET 24 | OFF | ON | ON |
| FET 26 | ON | OFF | OFF |
| FET 23 | OFF | OFF | ON |
| FET 25 | ON | ON | OFF |
| FET 27 | ON | ON | OFF |

It will be evident from Table 1, when a charge of "0" level is read out from CCD 11 (FET 16: ON, FET 17: ON), only the output circuit 20c is rendered conductive and upon reading out a charge of "1" level from CCD 11 only the output circuit 20b is rendered conductive. When a charge of "2" level is read out from CCD, only the output circuit 20a is rendered conductive. Consequently, a multivalued signal read out from CCD 11 has its levels detected by the level detection section and outputs having the respective voltage levels constituting the multivalued signal are produced time sequentially at the output section. The reproduced multivalued signal $V_S$ is fed back to the source of the input FET 12.

Figure 4:
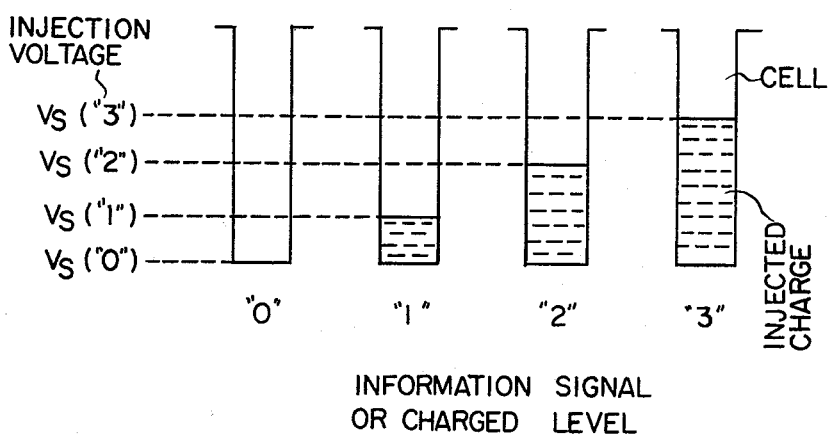
FIG. 4 is a schematic diagram showing the relationship of the source voltage levels of an injection field effect transistor (FIG. 1) as a multivalued signal injecting means, to the injected charge levels of potential wells in a charge coupled device in the case of a four-valued signal.
Figure 5:
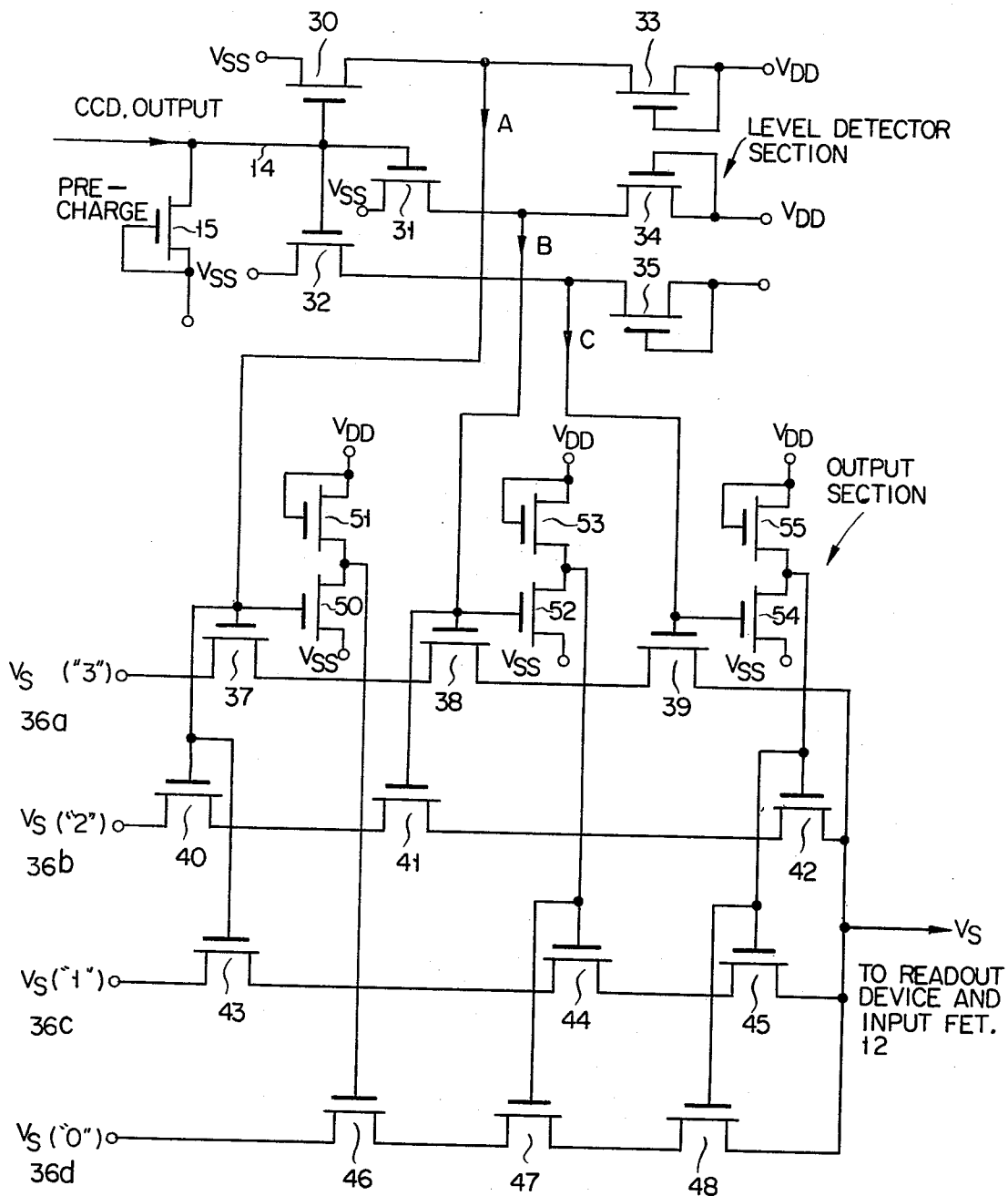
FIG. 5 is a schematic circuit diagram showing another arrangement of a sense amplifier which may be used in the system of FIG. 1 in the case of a four-valued signal.

This invention can also be applied to a multivalued signal having four voltage levels which include four respective information levels. FIG. 4 shows a relation of voltage levels of a source voltage applied to the source of the input FET 12, to injected charge levels into the potential wells of CCD. The levels of injected charges corresponding to the source voltage levels ("0"), $V_S$("1"), $V_S$("2") and $V_S$("3") are represented by "0", "1", "2", and "3", respectively. FIG. 5 shows by way of example the circuit arrangement of a sense amplifier 12 (FIG. 1) when a four-level signal is involved. Since the circuit arrangement in FIG. 5 is similar in principle to the circuit arrangement in FIG. 3, explanation will be restricted only to a main portion of the circuit arrangement in FIG. 5.

To an input line 14 are connected a first inverter comprising FET's 30 and 33, a second inverter comprising FET's 31 and 34, and a third inverter comprising FET's 32 and 35. An output A is derived from the first inverter, an output B from the second inverter and an output C from the third inverter. The threshold voltages Vth30 of FET 30, Vth31 of FET 31 and Vth32 of FET 32 are so set that a relation Vth32 > Vth30 > Vth31 is satisfied. Four output circuits 36a, 36b, 36c and 36d are provided in an output section. The circuit 36a includes FET 37 to the source of which an injection voltage $V_S$("3") is applied, and FET's 38 and 39 connected in series to FET 37. The circuit 36b includes FET 40 to the source of which an injection voltage $V_S$ ("2") is applied, and FET's 41 and 42 connected in series to FET 40. The circuit 36c includes FET 43 to the source of which an injection voltage $V_S$("1") is applied, and FET's 44 and 45 connected in series to FET 43. The circuit 36 includes FET 46 to which an injection voltage $V_S$("0") is applied, and FET's 47 and 48 connected to FET 46. FET's 50 and 51 constitutes a fourth inverter; the output of which is applied to the gate of FET 46, FET's 52 and 53 constitutes a fifth inverter, the output of which is applied to FET's 44 and 47; and FET's 54 and 55 constitutes a sixth inverter, the output of which is applied to the gates of FET's 45 and 48. The output A of the level detector section is supplied to the gates of FET's 37, 40, 43 and 50; the output B of the level detector section is supplied to the gates of FET's 38, 41 and 52; and the output C of the level detector section is supplied to the gates of FET's 39 and 54. The sources of FET's 39, 42 and 48 are connected together and an output voltage $V_S$, i.e., a reproduced four-level signal is fed back to the source of the input FET 12.

As will be easily understood from FIG. 3, in the sense amplifier shown in FIG. 5 the level "0", "1", "2" and "3" of charges read out of CCD 11 are discriminated by a combination of output signals A, B and C of the level detector section, and the conduction of the output circuits 36a, 36b, 36c and 36d in the output section is selected and in consequence a reproduced four-level signal $V_S$ are fed back to the source of the input FET 12. The relation of the "ON" and "OFF" of each FET to the levels of charges read out of CCD 11 is shown in Table 2. It will be apparent from Table2 that from among the output circuits 36a to 36d one specific output circuit is selected for conduction, according to each detected level of the output of CCD and therefore a four-level signal read out from CCD 11 is reproduced.

Table 2

|        | Charged level "0" | Charged level "1" | Charged level "2" | Charged level "3" |
|--------|-------------------|-------------------|-------------------|-------------------|
|        | FET 30: ON        | FET 30: OFF       | FET 30: OFF       | FET 30: OFF       |
|        | FET 31: ON        | FET 31: ON        | FET 31: OFF       | FET 31: OFF       |
|        | FET 32: ON        | FET 32: ON        | FET 32: ON        | FET 32: OFF       |
| FET 37 | OFF               | ON                | ON                | ON                |
| FET 40 | OFF               | ON                | ON                | ON                |
| FET 43 | OFF               | ON                | ON                | ON                |
| FET 46 | ON                | OFF               | OFF               | OFF               |
| FET 38 | OFF               | OFF               | ON                | ON                |
| FET 41 | OFF               | OFF               | ON                | ON                |
| FET 44 | ON                | ON                | OFF               | OFF               |
| FET 47 | ON                | ON                | OFF               | OFF               |
| FET 39 | OFF               | OFF               | OFF               | ON                |
| FET 42 | ON                | ON                | ON                | OFF               |
| FET 45 | ON                | ON                | ON                | OFF               |
| FET 48 | ON                | ON                | ON                | OFF               |

It will be understood that the sense amplifier can be similarly modified, based on the above-mentioned principle, with respect to a signal with five or more levels.

Figure 6:
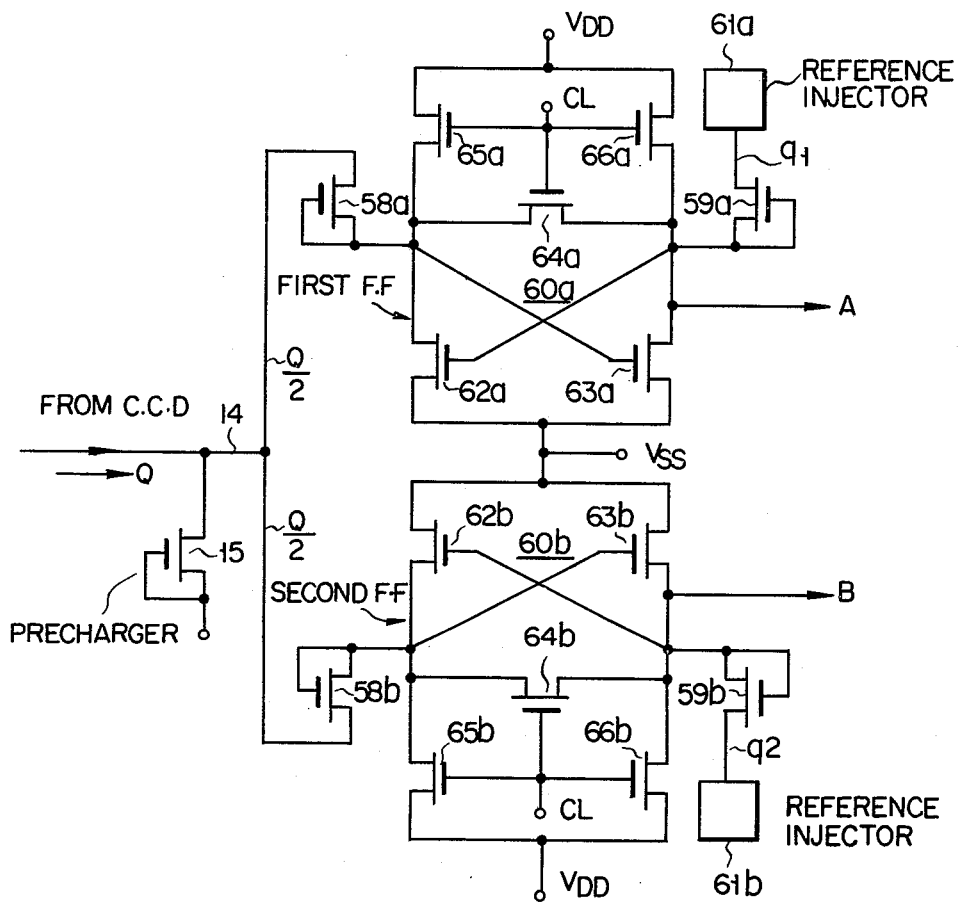
FIG. 6 is a schematic circuit diagram showing a modified form of a level detection circuit for use in the sense amplifier of FIG. 1.

The level detector section in FIG. 3 can be constructed as shown in FIG. 6. In FIG. 6 one input terminal of a flip-flop circuit 60a is connected through FET 58a to output line 14 from the CCD device. A reference injector 61a is connected through FET 59a to the other input terminal of the flip-flop circuit 60a. The flip-flop circuit 60a includes FET's 62a, 63a, 64a, 65a, and 66a. A clock pulse CL is supplied to the gates of FET's 64a to 66a and a drain voltage $V_{DD}$ is supplied to the drains of FET's 65a and 66a. The one input terminal is connected to the gate of FET 63a and the other input terminal is connected to the gate of FET 62a.

A flip-flop 60b, similar in arrangement to the flip-flop circuit 60a, is also connected to the output line 14 and includes input and output parts similar to those in the flip-flop 60a. For brevity's sake a suffix b is added to parts or elements in the flip-flop 60b which correspond to parts or elements in the flip-flop 60a. The sources of FET's 62a and 63a are connected at a junction to the sources of FET's 62b and 63b and a source voltage $V_{SS}$ is applied through the junction to the sources of FET's 62a, 63a, 62b and 63b. The outputs of the flip-flop 60a and 60b are represented by A and B, respectively.

With Q("0"), Q("0") and Q("2") respectively representing charges (supplied from the output line 14) having levels "0", "1" and "2", charges $q_1$ and $q_2$ are set to satisfy the following relation:

$$\frac{(Q(``0")}{2} < q_1 < \frac{Q(``1")}{2} < q_2 < \frac{Q(``2")}{2}$$

where
- $q_1$ : charge supplied from reference injector 61a to FET 59a
- $q_2$ : charge supplied from reference injector 61b to FET 59b Table 3 shows a combination of outputs A and B corresponding to output levels "0", "1" and "2" from CCD 11. The meaning of "ON" and "OFF" in Table 3 has already been explained.

Table 3

|     | A   | B   |
|-----|-----|-----|
| "2" | ON  | ON  |
| "1" | ON  | OFF |
| "0" | OFF | OFF |

The reference injectors 61a and 61b have, unlike the cell of CCD 11, a different geometrical size. Since the amount of charge to be injected into the cell is determined by the geometrical size of the cell and the injected level, it is necessary that the relation $$\frac{(Q(``0")}{2} < q_1 < \frac{Q(``1")}{2} < q_2 < \frac{Q(``2")}{2}$$

be satisfied and that at the same time the geometrical size of the cell of the reference injector and the injected level be determined to make the detection sensitivity maximum. The method for using the above-mentioned flip-flop circuit is applicable to the case where a multivalued signal has four or more levels. If, for example, a binary signal is converted to a four-valued (four-level) signal for storage in the CCD device, the relationship of the binary signal to the four-valued signal may be as follows:

Table 4

| Binary signal | 11 | 00 | 10 | 01 | 11 | 10 | 10 | 11 | 00 | 01 |
|---|---|---|---|---|---|---|---|---|---|---|
| Levels of four level signal | 3 | 0 | 2 | 1 | 3 | 2 | 2 | 3 | 0 | 1 |

That is, it is necessary first that the series of input binary bits be divided into 2-bit blocks and each 2-bit block be converted to a level of four-valued signal for storage at a speed of one-half that which would normally be used to store the binary information.

With n representing the number of binary bits to be divided into a block and N representing the number of levels in a multivalued signal, the following relation is generally established.

$$N = 2^n$$

Suppose that two (first and second) series of binary bits are converted to four-valued (four-level) signal for storage. In this case, two bits, one bit from the first series of input binary bits and the other from the second series of input binary bits, may be encoded as a four-valued signal as shown in Table 5.

Table 5

| | | | | | | | | | | | | | | | | | | | |
|---|---|---|---|---|---|---|---|---|---|---|---|---|---|---|---|---|---|---|---|
| First series of input binary bits | 1 | 1 | 0 | 0 | 1 | 0 | 0 | 1 | 1 | 1 | 1 | 0 | 1 | 0 | 1 | 1 | 0 | 0 | 1 |
| Second series of input binary bits | 1 | 0 | 1 | 1 | 0 | 0 | 0 | 0 | 1 | 0 | 1 | 0 | 1 | 1 | 0 | 0 | 1 | 0 | 0 |
| Levels of 4-level signal | 3 | 2 | 1 | 1 | 2 | 0 | 0 | 2 | 3 | 2 | 3 | 1 | 3 | 1 | 2 | 2 | 1 | 0 | 1 | 2 |

Although the above-mentioned embodiment has been explained as operated at a saturated region using p-channel enhancement mode FET's, this invention can be put to practice using p-channel or n-channel depletion mode FET's. Alternatively, each FET can be operated at a triode region or operated by a Bootstrap system.

It is desirable that, as a method for setting the threshold voltage of FET's 30, 31 and 32 to respectively different values, each FET be manufactured by an ion implantation method. This invention, however, is not restricted to this method. By making a source potential applied to the source of one FET higher than a source potential applied to the source of the other FET the threshold voltage of one FET can be set to be higher than that of the other FET using a back gate bias effect.

What is claimed is:

1. A memory system including a charge coupled device for storing in a channel of said charge coupled device an analog multivalued signal having at least three information carrying levels represented by an analog voltage level at the output terminal of said charge coupled device, said system comprising: injection means for injecting the multivalued signal in the form of electric charge into said charge coupled device; and detection means connected to the output terminal of said charge coupled device and adapted to detect the level of said multivalued signal and feed a voltage representing said level back to said injection means, said detection means including a level detection section having threshold detection means connected to the output terminal of said charge coupled device and constructed and arranged to simultaneously compare the voltage signal on said output terminal against at least two fixed voltage threshold levels and to generate a combination of binary outputs representing the multivalued signal level read out from the output terminal of said charge coupled device, and an output section for generating upon receipt of said combination of binary outputs an multivalued output having a voltage level corresponding to said combination of outputs.

2. The memory system according to claim 1, in which said level detection section of said detection means includes a plurality of inverter circuits one less than the number of information levels of said multivalued signal, each of said inverter circuits including a field effect transistor whose gate electrode is coupled to the output terminal of said charge coupled device, the voltage threshold value of each of said field effect transistors being set to a different value which corresponds to the voltage level of said multivalued signal, the arrangement of said inverters permitting generation of said different combination of outputs corresponding to the voltage level to be detected.

3. The memory system according to claim 1, in which said level detection section of said detection means includes $n$ number of flip-flop circuits one less than the number of information levels of said multivalued signal; each of said flip-flop circuit including means for supplying an amount of $1/n$ of charge supplied from the output terminal of said charge coupled device to one input terminal of the flip-flop circuit, means for supplying through a reference injector to the other input terminal of the flip-flop circuit an amount of charge to be compared with said amount of $1/n$ of charge which is supplied to said one input terminal of the flip-flop circuit, and means for taking out a comparison output corresponding to a difference between said amount of $1/n$ of charge supplied to said one input terminal of the flip-flop circuit and said amount of charge supplied to said other terminal of the flip-flop circuit, a combination of the comparison outputs from said flip-flop circuits corresponding to said predetermined different combination of outputs.

4. The memory system according to claim 1, in which said output section of said detection means includes output circuits equal in number to said information levels of said multivalued signals, each of said output circuits including a first field effect transistor to which a source voltage corresponding to one selected information level of said multivalued signal is supplied and at least one other field effect transistor connected in series to said first field effect transistor, said output circuits being controlled by said combination of outputs from said level detection section to generate said multivalued output signal.

* * * * *